US006967506B2

(12) United States Patent
Roger (10) Patent No.: US 6,967,506 B2
(45) Date of Patent: Nov. 22, 2005

(54) CIRCUIT ARRANGEMENT FOR THE DISCRETE-TIME COMPARISON OF SIGNALS

(75) Inventor: Frederic Roger, Munich (DE)

(73) Assignee: Xignal Technologies AG, Unterhaching (DE)

( * ) Notice: Subject to any disclaimer, the term of this patent is extended or adjusted under 35 U.S.C. 154(b) by 444 days.

(21) Appl. No.: 10/321,154

(22) Filed: Dec. 17, 2002

(65) Prior Publication Data

US 2003/0145266 A1 Jul. 31, 2003

(30) Foreign Application Priority Data

Dec. 19, 2001 (DE) .......................................... 101 62 277

(51) Int. Cl.[7] .............................................. H03K 5/22
(52) U.S. Cl. ...................................................... 327/64
(58) Field of Search .............................. 327/52, 55, 57, 327/63–65, 68, 72, 77–83, 89–90, 199–201, 215, 219

(56) References Cited

U.S. PATENT DOCUMENTS

| 6,396,310 B2 * | 5/2002 | Shin ............................ 327/55 |
| 6,507,224 B1 * | 1/2003 | Lee et al. ....................... 327/91 |
| 6,617,885 B2 * | 9/2003 | Lim et al. ...................... 327/57 |

OTHER PUBLICATIONS

G.M. Yin et al, "A High–Speed CMOS Comparator with 8–b Resolution", IEEE Journal of Solid–State Circuits, vol. 27, No. 2, Feb. 1992, pp. 208–211.

* cited by examiner

Primary Examiner—My-Trang Nu Ton
(74) Attorney, Agent, or Firm—Pearne & Gordon LLP (57) ABSTRACT

The invention pertains to a circuit arrangement (comparator) for the discrete-time comparison of input signals (ip, vrefp) and for making available a pair of complementary output levels (vdd, vss) which corresponds to the result of the comparison on a line pair (P, N), wherein said circuit arrangement comprises a reset circuit (12) for balancing the line potentials during a reset phase, an input circuit (14) for generating a potential difference on the line pair (P, N) in accordance with an input signal difference, a first bistable flip-flop (16) for amplifying the generated potential difference and a second bistable flip-flop (20) that is connected by means of a connecting circuit (18) and serves for additionally amplifying the generated potential difference to the desired complementary output levels.

According to the invention, a third bistable flip-flop (30a, 30b) is provided that, when connecting the second flip-flop (20) parallel to the first flip-flop (16), amplifies the generated potential difference and thusly reduces the comparison time without significantly impairing the current consumption.

17 Claims, 5 Drawing Sheets

CIRCUIT ARRANGEMENT FOR THE DISCRETE-TIME COMPARISON OF SIGNALS

BACKGROUND OF THE INVENTION

1. Field of the Invention

The invention pertains to a circuit arrangement or a comparator according to the preamble of claim 1.

2. Description of the Prior the Art

A circuit arrangement of this type is, for example, described in G. M. Yin et al., "A High-Speed CMOS Comparator with 8-b Resolution," IEEE Journal of Solid-State Circuits, Vol. 27, No. 2, February, 1992, and serves for the discrete-time comparison of a first input signal with a second input signal (frequently a constant reference signal or a threshold), as well as for making available a pair of complementary binary output signals which corresponds to the result of the comparison (logic level).

A comparison of two input signals with one another respectively takes place in three successive time intervals that, according to this application, are referred to as reset, phase 1 and phase 2. In the above-mentioned IEEE article, the corresponding time intervals are referred to as "reset time interval," "first step of regeneration" and "second step of regeneration." With respect to the function and optimization of such a circuit arrangement, we hereby refer to the aforementioned IEEE Article, in which these aspects are described in detail.

In summation, a pair of complementary binary output signals which corresponds to the result of the comparison is made available on a line pair as described below: in the reset phase, the first flip-flop is changed over into an astable state. The difference between the input signals then leads to a comparatively small potential difference between the two lines in phase 1. This potential difference is then amplified with a certain time constant by the first flip-flop. In this case, it is decisive that the potential difference becomes as high as possible within the shortest possible time. A high-speed (small time constant) in this phase 1 is achieved if the capacitance of the first section of the line pair is as low as possible and the amplification (e.g., transconductance) of the first flip-flop simultaneously is as high as possible. It is usually not possible to simultaneously optimize these two parameters, i.e., an increase in the amplification of a flip-flop usually also leads to an increase in the capacitance (as well as the current consumption) in practical applications. Consequently, it is practical to find a suitable compromise between current consumption, capacitance and amplification for the respective application. In phase 2, the connecting circuit connects a second section of the line pair and consequently a second bistable flip-flop to the first section of the line pair such that the potential difference on the two lines is additionally amplified by the second flip-flop in phase 2. In this phase, it is attempted to bring both potentials to at least approximately logic levels, i.e., the desired complementary binary output potentials. In this case, the first flip-flop "draws" one of the two potentials to the first supply potential, with the second flip-flop drawing the other potential to the second supply potential. The problem can be seen in the fact that the amplification of the first flip-flop and consequently the speed in phase 2 is limited in practical applications due to the above-mentioned compromise with respect to the dimensions of the first flip-flop.

The function of such circuit arrangements that are also referred to as comparators below is required in various applications. One noteworthy example is the utilization of comparators in analog/digital converters. The main function of a comparator consists of making available the output signal(s) correctly and as rapidly as possible. In integrated circuit arrangements that, in particular, are designed for a high data throughput, comparators frequently represent a limiting component for the entire system due to their finite comparison speed.

SUMMARY OF THE INVENTION

The invention is based on the objective of improving the performance characteristics, in particular, the comparison speed, of a circuit arrangement of the above-mentioned type.

This objective is attained with a circuit arrangement according to claim 1. The dependent claims pertain to advantageous additional developments of the invention.

The circuit arrangement according to the invention is characterized by a third bistable flip-flop for connecting one of the two lines to the first supply potential in accordance with the generated potential difference during the third time interval (phase 2). This is carried out as described below: during phase 2, the third bistable flip-flop connects one of the two lines (namely the same as the first flip-flop) to the first supply potential parallel to the first bistable flip-flop. Due to this measure, the amplification of the first flip-flop is increased by the amplification of the third flip-flop in this phase such that the speed, with which the potentials are "drawn" to the two supply potentials in a complementary fashion, is significantly increased. This means that the invention makes it possible to reduce the duration of phase 2, namely without a noteworthy increase in the current consumption of the circuit arrangement. It was determined that the comparison time can, for example, be reduced by approximately 40%. The circuit arrangement according to the invention can be advantageously realized in accordance with the CMOS technology.

With respect to the dimensions of the first and the second flip-flop according to the invention, it is practical that these dimensions remain more or less unchanged. With respect to the first flip-flop, it is, in particular, important that a comparatively high amplification does not lead to an excessive capacitance and/or an excessive current consumption. According to the invention, the dimensions of the first and the second flip-flop consequently should be realized such that a short duration of phase 1 is also achieved.

Since a third flip-flop is provided, an additional capacitive load occurs on both line sections of the second section of the line pair. The negative effect of an increase in the duration of phase 2 which is expected due to the capacitive load does not occur in practical applications, namely because the input signal difference is already significantly amplified in phase 2. The decisive effect is a reduction in the duration of phase 2 due to the additional amplification achieved with the aid of the third flip-flop.

The reset circuit can be easily realized such that it short-circuits the two line sections of the first section during the reset phase, for example, by means of a FET, the channel of which connects these two line sections to one another and the gate of which is triggered for the short-circuiting process by a first clock signal. Alternately, it would be conceivable to connect these two line sections to a predetermined reference potential, for example, by means of two FETs, the channels of which produce this connection when a first clock signal collectively triggers their gates.

The input circuit may be realized such that a current flowing to at least one (preferably both) of the two line sections of the first section is varied in accordance with the input signal difference. Due to this measure, the potentials of both line sections can be easily shifted relative to one another in dependence on the input signal difference. In this case, a constant current is preferably divided over both line sections. A person skilled in the art is familiar with various circuit concepts for realizing this measure. Independently of the type of the two input signals (currents, voltages, "single-ended," "fully-differential"), it merely needs to be ensured that a difference between the input signals leads to a change of the output current(s). A differential transconductance stage, for example, is suitable as the input circuit for input signals in the form of input voltages. Such an amplifier can be easily realized with a common source or common drain of FETs, to the gates of which one of the two input signals is respectively applied, the sources or drains of which are connected to a current source and the drains or sources of which are respectively connected to one of the two line sections.

In one preferred embodiment, the first and/or second and/or third bistable flip-flop comprises two cross-coupled or regeneratively coupled FETs, wherein a first channel terminal of each FET is connected to one of the two supply potentials and a second channel terminal of each FET is respectively connected to one of the two lines. According to the invention, it is, in principle, possible to realize the flip-flops in the form of any circuit that is connected to the two lines or connected to these two lines in the pertinent time interval and amplifies the potential difference between the two lines in dependence on the proceeding sign of this potential difference. This means that this circuit shifts at least one of the two potentials in the direction of one of two supply potentials, e.g., for making available a "rail-to-rail" output potential. The term "supply potential" refers, in the sense of this description, to arbitrary, fixed potentials, i.e., to fixed intermediate potentials or reference potential of an entire system, into which the comparator is integrated.

The connecting circuit can be easily realized with two FETs, the channels of which respectively connect a line section of the first section to a line section of the second section and the gates of which are collectively triggered by a second clock signal. With respect to the time sequence of each comparison process, such a second clock signal needs to be suitably correlated with the first signal (for the reset process). One of these clock signals can be conventionally generated from the other clock signal or both of these clock signals can be generated from a common clock signal.

It is preferred that a second reset circuit is provided for balancing potentials on the second section of the line pair during the reset phase and/or phase 1. This measure leads to a particularly well defined (astable) state of the second bistable flip-flop at the beginning of phase 2.

In order to prevent any negative influence of the third bistable flip-flop during the reset phase and phase 1, this third flip-flop preferably is not effectively connected to the two lines until the beginning of phase 2. In this case, the connection is preferably produced by means of the channel of a FET, the gate of which is triggered by the above-mentioned second clock signal such that the third flip-flop can be easily connected synchronously with the second flip-flop.

In one preferred embodiment, the third flip-flop acts upon the second section. This can be realized in such a way that the third bistable flip-flop connects one of the two line sections of the second section of the line pair to the first supply potential. When the third flip-flop is triggered by the gates of crossed-coupled FETs, it is also advantageous that these gates are connected to the second section of the line pair. Due to these measures, the generation of the complementary binary output potentials on the two lines is not impaired, in particular, slowed down, by the finite resistance of the connecting circuit.

BRIEF DESCRIPTION OF THE FIGURES

FIG. 2 shows one concrete embodiment of the circuit arrangement according to FIG. 1, and FIGS. 3–5 show simplified representations according to FIG. 2, in which certain circuit components are, in accordance with the respective phase, omitted or illustrated in the form of a line connection so as to elucidate the time sequence of a comparison process (reset, phase 1, phase 2).

DESCRIPTION OF PREFERRED EMBODIMENTS

Figure 1:
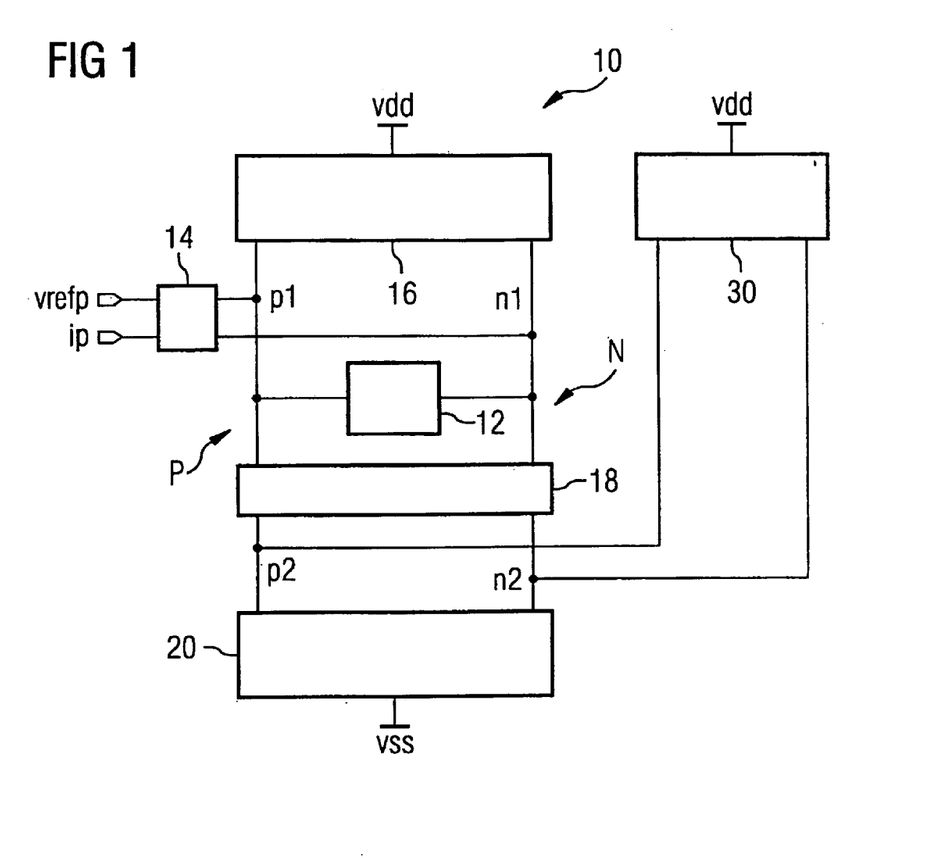
FIG. 1 shows a block diagram of a comparator in the form of an integrated circuit arrangement.

The invention is described in greater detail below with reference to one embodiment and the enclosed figures. FIG. 1 shows an integrated circuit arrangement 10 (comparator) in the form of a block diagram. This circuit arrangement 10 serves as a component of an integrated circuit for the discrete-time comparison of a first input signal ip with a second input signal vrefp and for making available a pair of complementary binary output potentials vdd, vss which corresponds to the result of the comparison on a pair of lines P, N. In the embodiment shown, the output potentials vdd, vss simultaneously are the potentials, with which the entire circuit arrangement is supplied.

In this case, the second input signal vrefp is, as in many applications, a predetermined constant reference level, with which the first input signal ip is compared. Each individual comparison takes place in three successive time intervals that are referred to as the reset phase, phase 1 and phase 2.

During the reset phase, a reset circuit 12 balances the two potentials applied to a first section p1, n1 of the line pair P, N. This is realized by short-circuiting the two line sections p1 and n1 with the aid of the reset circuit 12.

This short-circuit between p1 and n1 is subsequently terminated, namely at the beginning of phase 1, and a potential difference between the two line sections p1 and n1 is generated during the course of phase 1 in accordance with an input signal difference ip-vrefp by means of an input stage 14 that receives the input signals ip, vrefp. For this purpose, the input circuit 14 is realized in the form of a differential amplifier stage that distributes a current over the line sections p1 and n1 in dependence on the input signal difference. A first bistable flip-flop 16 for amplifying the generated potential difference between p1 and n1 is connected to the line sections p1, n1. This flip-flop 16 receives the first supply potential vdd in order to "draw" one of the two potentials of the line sections p1, n1 (the potential that lies closer to the potential vdd) in the direction of the first supply potential vdd. In the simplest instance, a direct conductive connection between p1 or n1 and the potential vdd is produced.

Phase 2 is initiated by activating a connecting circuit 18 for connecting the first section p1, n1 of the line pair P, N to a second section p2, n2 of the line pair P, N. A second bistable flip-flop 20 is connected to the second section p2, n2, wherein this second bistable flip-flop serves for amplifying the two potentials on p1, n1 which, after connecting the second section p2, n2, are at least approximately present on this second section as well. In this case, the second flip-flop 20 may be realized analogous to the first flip-flop 16, wherein the second flip-flop 20 draws, however, one of the line sections p2, n2 in the direction of the second supply potential vss and is connected to this potential vss for this purpose. For example, if the flip-flop 16 shifts the potential from p1 in the direction of vdd, the flip-flop 20 shifts the potential from n2 in the direction of vss.

The function of the circuit arrangement 10 which was described so far corresponds to the function of the comparator known from the initially mentioned IEEE article. After a certain duration, i.e., at the end of phase 2, the complementary binary output signals vdd and vss are made available on the lines P and N and can be additionally utilized in downstream regions of the integrated circuit which are not shown in FIG. 1. After the connecting circuit 18 connects the line sections p1, n1 to the line sections p2, n2, the output signals can be derived from the first section p1, n1, as well as the second section p2, n2.

Figure 1A:
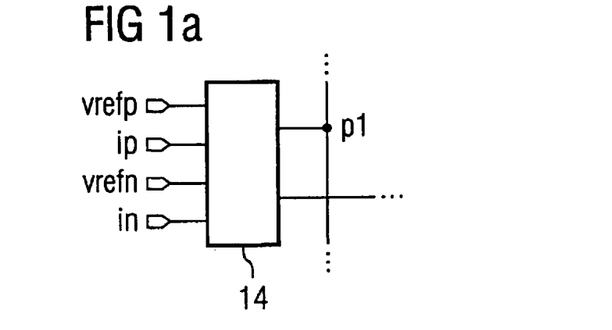
FIG. 1a shows a modified embodiment of the input circuit provided with the comparator according to FIG. 1.

FIG. 1a shows a generally known modification of the input circuit 14, namely a fully differential input circuit that may also be realized in accordance with the invention.

In order to reduce the duration required for the comparison, a third bistable flip-flop 30 is provided for amplifying the potential difference between the two lines P, N during phase 2. This flip-flop 30 is also realized analogous to the first flip-flop 16 and connected to the first supply potential vdd in order to apply this potential vdd to one of the two line sections p2, n2. The third flip-flop 30 increases the total amplification during phase 2 such that this phase and thusly the entire comparison is accelerated. The thusly realized additional amplification in phase 2 is particularly practical if the amplification of the parallel-connected first flip-flop 16 is chosen relatively low, e.g., as it is advantageous for reducing the capacitance and/or the current consumption of the first flip-flop 16 (in order to accelerate the reset phase and phase 1).

The timing of the three above-mentioned phases takes place in accordance with one or more clock signals (not shown in FIG. 1), wherein said clock signals activate and deactivate the reset circuit 12 and the connecting circuit 18 in a timed fashion.

Figure 2:
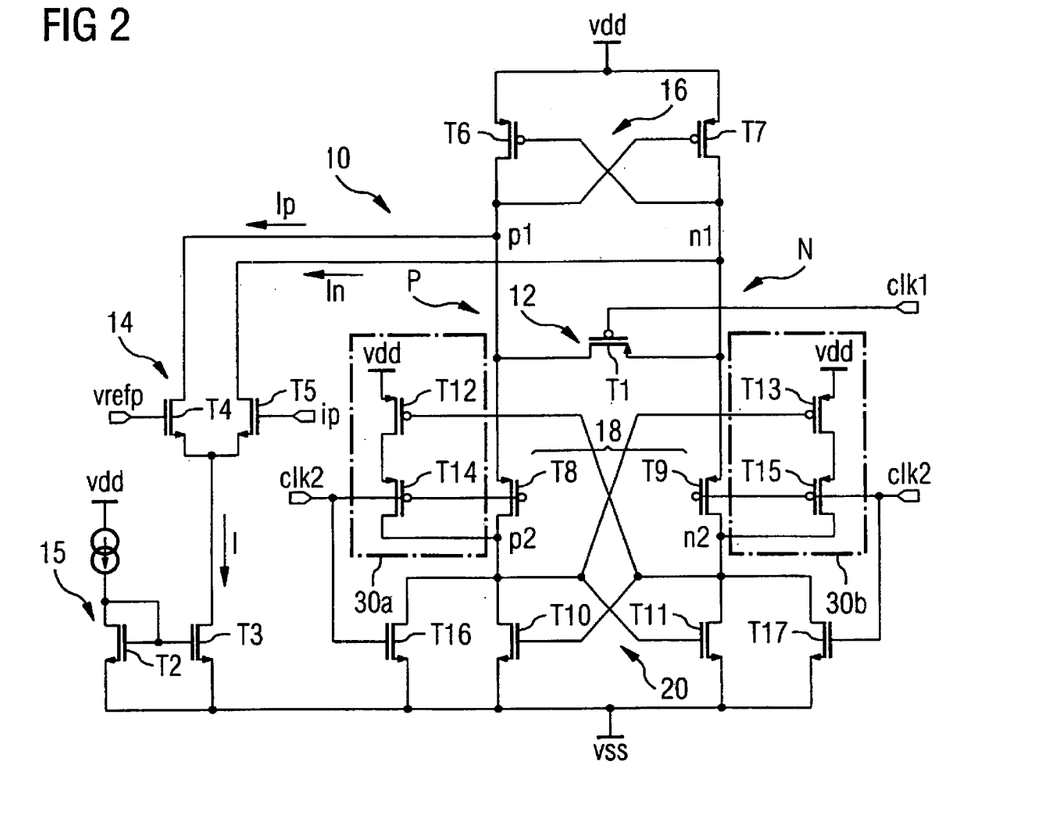

FIG. 2 shows one concrete embodiment of the comparator 10 that is schematically illustrated in FIG. 1 and serves for comparing the input potential ip with the reference potential vrefp.

The timing of the comparator 10 that is realized in accordance with the CMOS technology is realized with the aid of two clock signals clk 1, clk2 that assume the following (logic) potential values during the individual phases:

|      | Reset Phase | Phase 1 | Phase 2 |
| --- | --- | --- | --- |
| clk1 | low  | high | high |
| clk2 | high | high | low  |

Figure 3:
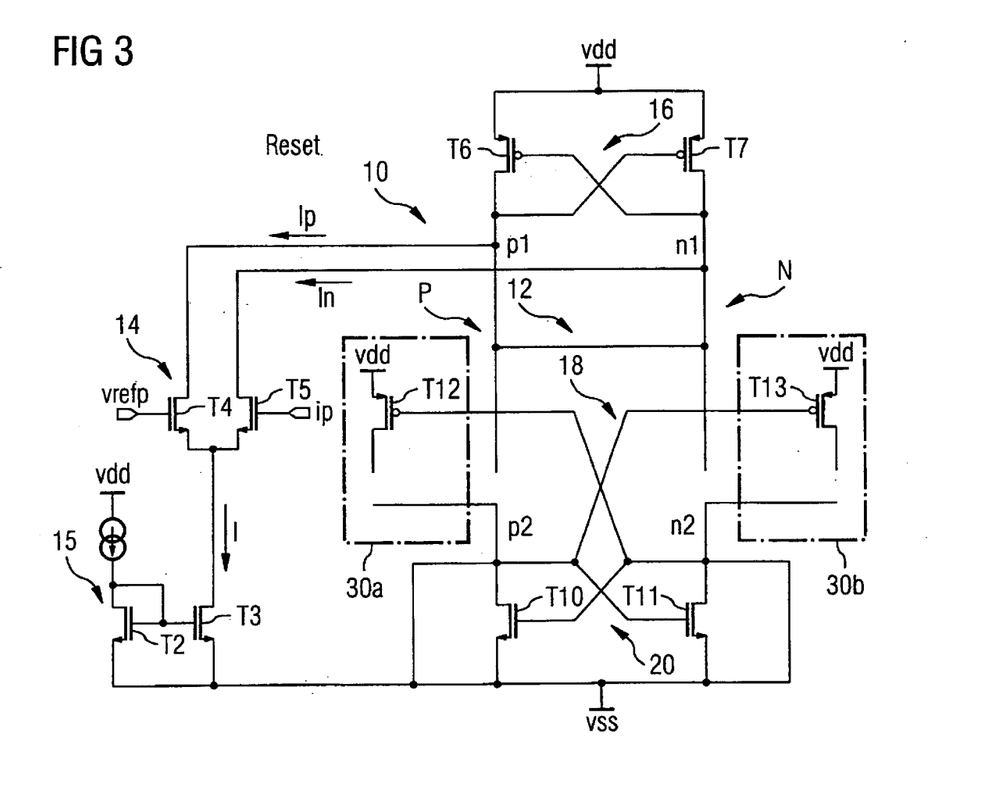

The reset circuit 12 for balancing the potentials on the lines P and N is formed by a p-channel FET T1, the channel of which short-circuits the two line sections p1 and n1 during the reset phase. The circuit state during the reset phase is illustrated in a simplified fashion in FIG. 3.

Figure 4:
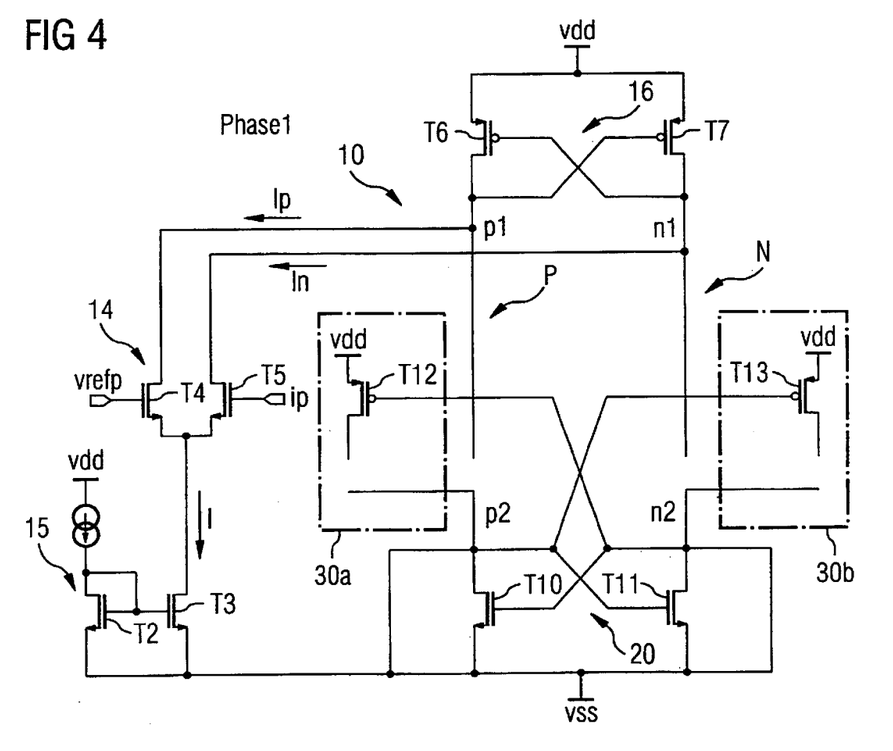

The input stage 14 is conventionally supplied with a constant current I by a current balancing circuit 15 that comprises a pair of n-channel FETs T2, T3. The input stage 14 that functions as a differential transconductance stage comprising an adapted FET pair T4, T5 divides this current I into two partial currents Ip, In in accordance with an input signal difference ip-vrefp. These partial currents Ip, In are applied to the line sections p1, n1 such that the potentials on these line sections drift apart after deactivating the reset circuit 12 (beginning of phase 1). As mentioned above, the input stage 14 may, other than in the embodiment shown ("single-ended"), be realized in the form of a fully differential input stage with input signals vrefn, vrefp, ip, in (see FIG. 1a). The circuit state during phase 1 is illustrated in a simplified fashion in FIG. 4. The potential difference being generated is amplified by means of the bistable flip-flop 16 that comprises two cross-coupled FETs (FET T6 and T7), wherein the amplification or transconductance of the flip-flop 16 cannot be chosen arbitrarily high so as to prevent an increase in the capacitive load associated therewith. When optimizing this part of the circuit arrangement, it is, in particular, important to take into account the transistor widths of the FETs T6, T7 because they significantly influence the transconductance, as well as the capacitance of the flip-flop 16. The flip-flop 16 is advantageously realized in conventional fashion, namely in the form of an adapted transistor pair T6, T7, in which the sources are connected to one another and to the first supply potential vdd, the gates of one transistor are respectively connected to the drain of the other transistor and the drains of the transistors are respectively connected to one of the potential lines P and N. At the end of phase 1, the preceding sign of the potential difference between p1 and n1 already represents the result of the comparison.

Figure 5:
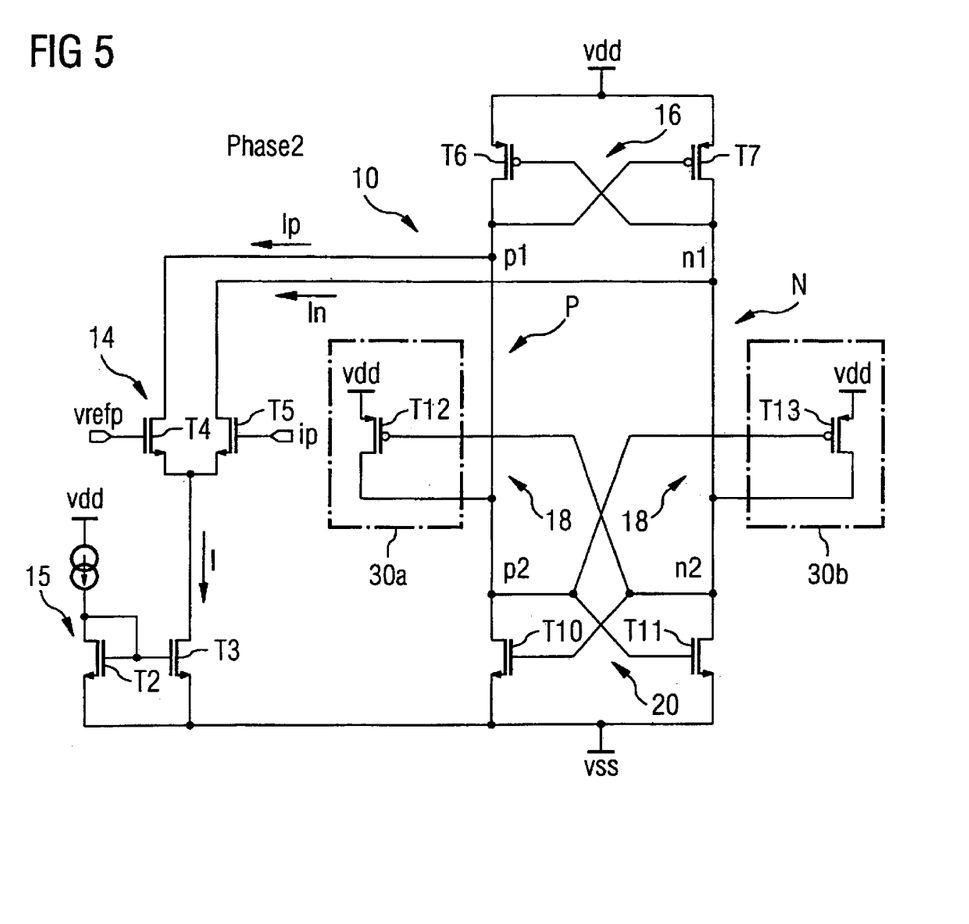

In the ensuing phase 2, it is attempted to bring the potentials on the lines P, N to approximately logic levels (in this case: vdd and vss). The circuit state during phase 2 is illustrated in a simplified fashion in FIG. 5. During this phase, the connecting circuit 18 that comprises a pair of FETs T8, T9 directly connects the first section p1, n1 of the line pair P, N to a second section p2, n2 of the line pair P, N, wherein these two FETs are arranged in the form of a common gate and collectively triggered by the second clock signal clk2. Due to this connection of the line sections p2, n2, the second bistable flip-flop 20 that comprises a pair of FETs T10, T11 has an amplifying effect on the potentials on the lines P, N. Except for the utilization of n-channel FETs T10, T11 and their arrangement in the form of a common source for being connected to the second supply potential vss, this second flip-flop 20 is realized analogous to the flip-flop 16.

In phase 2, the third bistable flip-flop 30 that comprises the circuit regions 30a and 30b is also rendered effective. Analogous to the previously described flip-flops 16, 20, this flip-flop 30 comprises a pair of FETs T12, T13 that is cross-coupled as described above in order to connect one of the lines P, N to the first supply potential vdd (as it is also the case with the flip-flop 16). It is particularly preferred that the flip-flop 30 is connected to the second section p2, n2 in the active state as shown (a connection to the first section p1, n1 would conceivably be possible, but lower the amplification of the circuit 30). In the circuit shown, it is particularly advantageous to connect the gates of the FETs T12, T13 to the second section p2, n2 (i.e., not to the first section p1, n1).

One peculiarity of the flip-flop 30 can be seen in the FETs T14, T15 that are arranged in the form of a serial circuit referred to the FETs T12, T13. This transistor pair ensures that the flip-flop 30 is not effectively (functionally) connected to the lines p2, n2 until the beginning of phase 2, i.e., this flip-flop is only effective in phase 2. For this purpose, the FETs T14, T15 are arranged in the form of a common gate and collectively triggered by the second clock signal clk2 applied to their gates.

FIG. 2 also shows an additional reset circuit that is formed by two FETs T16, T17 and serves for balancing the potentials on the two sections p2, n2 of the line pair P, N during the reset phase and phase 1. Due to the connection of the second section p2, n2 at the beginning of phase 2, it is ensured that the flip-flop 20 rapidly changes over into the correct stable state in accordance with the potential difference that is not yet fully defined at this time, i.e., that the transistor T11 is, for example, rendered conductive if the transistor T6 was previously rendered conductive (in phase 1).

In contrast to the described embodiment, it may, under certain circumstances, be advantageous if the supply potentials on the flip-flops 16, 30 (see, for example, FIG. 1) consist of potentials that differ from one another.

In summation, the circuit arrangement according to FIG. 2 represents a CMOS comparator with a comparison time that is reduced by 40% while the resolution and current consumption essentially remain the same. These improved performance characteristics are achieved with a circuit arrangement for the discrete-time comparison of input signals and for making available a pair of complementary output levels which corresponds to the result of the comparison on a line pair, wherein said circuit arrangement comprises a reset circuit for balancing the line potentials during the reset phase, an input circuit for generating a potential difference on the line pair in accordance with one or more input signal difference(s), a first bistable flip-flop for amplifying the generated potential difference, and a second bistable flip-flop that is connected by means of a connecting circuit and serves for additionally amplifying the generated potential difference to the desired complementary output levels, wherein a third bistable flip-flop is provided which, when connecting the second flip-flop parallel to the first flip-flop, amplifies the generated potential difference and thusly reduces the comparison time.

What is claimed is:

1. A circuit arrangement, in particular, an integrated circuit arrangement, for the discrete-time comparison of input signals (ip, vrefp; ip, vrefp, in, vrefn) and for making available a pair of complementary binary output potentials (vdd, vss) that corresponds to the result of the comparison on a pair of lines (P, N), comprising
   a reset circuit (12) for balancing potentials in a first section (p1, n1) of the line pair (P, N) during the first time interval (reset),
   an input circuit (14), to which the input signals (ip, vrefp; ip, vrefp, in, vrefn) are applied, wherein said input circuit serves for generating a potential difference on the first section (p1, n1) of the line pair (P, N) in accordance with an input signal difference at the beginning of a second time interval (phase 1),
   a first bistable flip-flop (16) for connecting one (p1 or n1) of the two line sections of the first section (p1, n1) of the line pair (P, N) to a first supply potential (vdd) in accordance with the generated potential difference,
   a connecting circuit (18) for connecting the first section (p1, n1) of the line pair (P, N) to a second section (p2, n2) of the line pair (P, N) during a third time interval (phase 2), and
   a second bistable flip-flop (20) for connecting one (n2 or p2) of the two line sections of the second section (p2, n2) of the line pair (P, N) to a second supply potential (vss) in accordance with the generated potential difference,
characterized by a third bistable flip-flop (30) for connecting one (P or N) of the two lines (P, N) to the first supply potential (vdd) in accordance with the generated potential difference during the third time interval (phase 2).

2. The circuit arrangement according to claim 1, wherein the reset circuit (12) is designed for short-circuiting the two line sections of the first section (p1, n1) during the first time interval (reset).

3. The circuit arrangement according to claim 2, wherein the reset circuit (12) comprises a FET, the channel of which connects the two line sections of the first section (p1, n1) to one another and the gate of which is triggered for the short-circuiting process by a first clock signal (clk1).

4. The circuit arrangement according to claim 1, wherein the input circuit (14) is designed for varying a current flowing to at least one of the two line sections of the first section (p1, n1) in accordance with the input signal difference.

5. The circuit arrangement according to claim 4, wherein the input circuit comprises at least one pair of FETs that are arranged in the form of a common source or common drain and to the gates of which one of the input signals (ip, vrefp, in, vrefn) is respectively applied, and wherein the sources or drains of these FETs are connected to a current source and their drains or sources are respectively connected to one of the two line sections (p1, n1).

6. The circuit arrangement according to claim 1, wherein the first and/or second and/or third bistable flip-flop (16, 20, 30) comprise(s) two crossed-coupled FETs, and wherein a first channel terminal of each FET is connected to one of the two supply potentials (vdd, vss) and a second channel terminal of each FET is respectively connected to one section of the two lines (P, N).

7. The circuit arrangement according to claim 1, wherein the connecting circuit (18) comprises two FETs, the channels of which respectively connect one line section of the first section (p1, n1) to a line section of the second section (p2, n2) and the gates of which are collectively triggered for the connecting process by a second clock signal (clk2).

8. The circuit arrangement according to claim 1, wherein a second reset circuit (T16, T17) is provided for balancing potentials on the second section (p2, n2) of the line pair (P, N) during the first time interval (reset) and/or the second time interval (phase 1).

9. The circuit arrangement according to claim 1, wherein the third bistable flip-flop (30) is effectively connected to the two lines (P, N) at the beginning of the third time interval (phase 2).

10. The circuit arrangement according to claim 9, wherein the connection is produced by the channel of at least one FET, the gate of which is triggered by a second clock signal (clk2).

11. The circuit arrangement according to claim 1, wherein the third bistable flip-flop (30) is provided for connecting one (n2 or p2) of the two line sections of the second section (p2, n2) of the line pair (P, N) to the first supply potential (vdd).

12. The circuit arrangement according to claim 1, wherein said circuit arrangement is realized in the form of one of several components of an integrated circuit.

13. The circuit arrangement according to claim 2, wherein the input circuit (14) is designed for varying a current flowing to at least one of the two line sections of the first section (p1, n1) in accordance with the input signal difference.

14. The circuit arrangement according to claim 2, wherein the first and/or second and/or third bistable flip-flop (16, 20, 30) comprise(s) two crossed-coupled FETs, and wherein a first channel terminal of each FET is connected to one of the two supply potentials (vdd, vss) and a second channel terminal of each FET is respectively connected to one section of the two lines (P, N).

15. The circuit arrangement according to claim 3, wherein the first and/or second and/or third bistable flip-flop (16, 20, 30) comprise(s) two crossed-coupled FETs, and wherein a first channel terminal of each FET is connected to one of the two supply potentials (vdd, vss) and a second channel terminal of each FET is respectively connected to one section of the two lines (P, N).

16. The circuit arrangement according to claim 2, wherein the connecting circuit (18) comprises two FETs, the channels of which respectively connect one line section of the first section (p1, n1) to a line section of the second section (p2, n2) and the gates of which are collectively triggered for the connecting process by a second clock signal (clk2).

17. The circuit arrangement according to claim 3, wherein the connecting circuit (18) comprises two FETs, the channels of which respectively connect one line section of the first section (p1, n1) to a line section of the second section (p2, n2) and the gates of which are collectively triggered for the connecting process by a second clock signal (clk2).

* * * * *